United States Patent [19]
Bloxam

[11] 4,028,621
[45] June 7, 1977

[54] PORTABLE AUTOMOTIVE TEST PROBE

[76] Inventor: James M. Bloxam, 133 Skyline Drive, St. Paul, Minn. 55110

[22] Filed: Dec. 18, 1975

[21] Appl. No.: 642,077

[52] U.S. Cl. .............................. 324/51; 324/72.5; 324/133
[51] Int. Cl.² ................ G01R 31/02; G01R 19/14; G01R 31/28
[58] Field of Search .......... 324/51, 72.5, 133, 149, 324/29.5, 17, 18, 119

[56] References Cited
UNITED STATES PATENTS

| | | | |
|---|---|---|---|
| 2,229,927 | 1/1941 | Kamper | 324/51 |
| 3,157,870 | 11/1964 | Marino et al. | 324/133 X |
| 3,259,754 | 7/1966 | Matheson | 324/133 X |
| 3,281,692 | 10/1966 | Beroset | 324/133 X |
| 3,437,916 | 4/1969 | Mazurkevics | 324/133 X |
| 3,543,154 | 11/1970 | Gordon | 324/133 X |
| 3,600,678 | 8/1971 | Garrett | 324/133 |
| 3,619,775 | 11/1971 | Naylor et al. | 324/133 X |
| 3,806,803 | 4/1974 | Hall | 324/133 |

FOREIGN PATENTS OR APPLICATIONS

| | | | |
|---|---|---|---|
| 1,210,441 | 3/1960 | France | 324/133 |
| 2,060,884 | 6/1972 | Germany | 324/133 |

Primary Examiner—Gerard R. Strecker
Attorney, Agent, or Firm—Merchant, Gould, Smith, Edell, Welter & Schmidt

[57] ABSTRACT

An improved electronic DC test probe particularly suitable for rapidly and flexibly trouble shooting automotive electrical systems. The test probe features highly reliable electronic circuits energized from an automotive battery through a pair of connector members suitable for connection to the terminals of the battery. A conductive test prod and a pair of indicator lamps are housed within a hand-held probe housing and enable an operator to rapidly trouble shoot the entire electrical system without alteration of any kind to the battery terminal connections. Electronic reference voltage establishing circuits protect the probe circuits and extend the operative life of the indicator lamps. The normally extinguished indicator lamps are illuminated only during actual test measurements with an intensity that varies proportionately with the measured signal. In one embodiment of the invention a single conductor extends from the probe chassis to a common terminal adjacent the connector members at the battery terminals. Another embodiment includes twin-beam lamps within the probe housing, enabling the probe to double as a trouble light.

12 Claims, 6 Drawing Figures

PORTABLE AUTOMOTIVE TEST PROBE

BACKGROUND OF THE INVENTION

1. Field of the Invention

This invention relates generally to electronic test equipment, and more particularly to an electronic test probe for trouble shooting automotive DC electrical systems.

2. Description of the Prior Art

In trouble shooting automotive electrical systems, it is desirable to have an easy to use hand-held probe which includes both a prod member for making electrical contact to various points throughout the system under inspection and which also bears indicator means providing direct immediate indication of the signal being received at the prod member. The visual readout capability as an integral part of the probe, enables the operator to rapidly follow signals through complicated circuits without having to turn his head or attention therefrom by referring to a remotely located indicator or instrument panel to read the parameter being measured. It is also desirable for such a test probe to be designed such that an operator can rapidly and seqentially take any electrical measurements required in the trouble shooting procedure without, after initial set-up of the probe, having to be concerned with the relative polarities of the power supply connections energizing the probe circuits. While such probes must be highly reliable and designed so as not to fail over extended periods of use, they should be sufficiently inexpensive so as to be readily accessible by the unprofessional casual user.

Automotive test probes having one or more of these features are known in the prior art. However, the prior art test probes fail to satisfy all of the above-listed desirable features. Most prior art test probes employ a plurality of indicator lamps in a hand-held probe unit for indicating positive or negative voltage parameters being measured by a prod member. Such prior art apparatus has generally operated in a mode such that both positive and negative indicator lamps are normally illuminated, wherein one or the other is thereafter extinguished when a voltage parameter is received by the prod member. Such operation necessarily dictates that both of the indicator bulbs be illuminated throughout practically the entire test measurement procedure, even though during a majority of that time test measurements are not being directly taken, thus reducing the effective operative life of the bulbs. Further, the probe circuitry of such prior art devices has been configured such that the full measured voltage is typically applied across the appropriate indicator bulb, subjecting such bulbs to severe transient conditions, thus further reducing their operative life. To counteract these disadvantages, prior art devices have typically either used telephone circuit bulbs having generally low visibility to the user, or have used bulbs with higher power ratings, which have been proportionately more expensive.

Many prior art test probes have been operable to merely indicate the presence or absence of a voltage signal at the test prod, and are inoperable to indicate the relative magnitude of the measured signal. Further, some test probes have included self-contained batteries for energizing their test circuits, but such devices are generally limited in their trouble-shooting application and provide a nusuance in the maintenance and replacement of the batteries. Since an automotive storage battery is generally readily available when trouble shooting automotive electrical systems, the majority of test probes for such applications have provided for energization of the test probe circuits directly from the output terminals of the storage battery. Such test devices have, however, been limited in the type of measurements which can be sequentially taken during a trouble shooting procedure, and have required the user to switch the polarity of the storage battery connections to the test probe, before certain measurements could be taken.

The present invention overcomes the disadvantages and problems associated with prior art automotive DC type probes, by providing an inexpensive and easy to use test probe which incorporates unique circuit design for maximizing reliability and life of individual components therein. With the test probe of this invention, the user can continuously sequentially perform all test measurements required during an extended trouble shooting procedure, including measurements which require readings of relative magnitudes of measured signals, without ever having to alter or change the polarities of the supply connections energizing the probe circuits from a storage battery.

While particular probe housing and battery terminal connector configurations will be disclosed, it will be understood that other configurations could equally well be employed. Also, while specific reference voltage establishing circuits will be disclosed with respect to the preferred embodiments of this invention, it will be understood that other circuit arrangements could equally well be configured with the reliability, simplicity and cost constraints of this invention. Further, while specific component values will be disclosed with respect to the preferred embodiment circuit configurations, it is apparent that one could design operatively equivalent test probe circuits using different component values.

SUMMARY OF THE INVENTION

The present invention provides an electronic test probe particularly suitable for trouble shooting automotive DC circuits. An electrically conductive test prod is mounted for projection from a housing member sized to be hand-held and easily manipulated by the user. A pair of indicator lamps, mounted in the housing so as to cast their illumination exterior of the housing for ready viewing by the user, are connected to the test prod and selectively indicate when illuminated the presence of a measured positive or negative voltage at the test prod. Rectifier devices in circuit with the indicator lamps and test prod enable energization of only one of the indicator lamps at a time.

The operative voltage which can be developed across the indicator lamp circuits is limited by means of a reference voltage establishing circuit, connected by means of rectifier devices to a pair of connector members suitable for operative attachment to the positive and negative or ground terminals respectively of an automotive storage battery. The connector members when operatively connected to the terminals of a storage battery, energize the electronic circuits of the test probe and provide a return or energization path, as the case may be, from and to respectively the prod member and through the appropriate indicator lamp to the storage battery. The reference voltage establishing circuit and associated rectifier devices may be physically mounted adjacent the connector members. In such case only a single flexible conductor lead is required to connect the reference voltage establishing circuit to the indicator lamp circuits in the remotely located probe housing, providing a flexible and easy to use test probe system. In another embodiment, the reference voltage establishing circuits are mounted within the probe housing which is also supplied in this embodiment with twin-beam lamps mounted to the housing member adjacent the projecting prod member, for casting a dual beam light pattern external of the housing member. This embodiment requires a pair of elongate conductors extending from the connector members at the storage battery to the probe housing, but eliminates the need for an auxiliary trouble light for trouble shooting in dark or dimly illuminated areas. The reference voltage establishing circuit also limits the voltage across the twin-beam lamps in this embodiment, thus minimizing transient stress and overload on all lamps of the test probe to prolong their usefull lives.

The appropriate indicator lamp is illuminated only when the test prod is placed in contact with an external circuit which establishes a return path to the storage battery terminals, and the intensity of illumination of the respective indicator lamp denotes the relative magnitude of voltage signal being measured at the test prod. In either embodiment of the invention, once the connector members are operatively clamped to the terminals of storage battery, a user of the test probe can rapidly sequentially execute as many test measurements as he desires in trouble shooting an automotive circuit, without ever having to glance away from the indicator lamps in the hand-held probe housing and without ever having to switch the polarities of the connector members for executing any of his desired measurements.

DESCRIPTION OF THE PREFERRED EMBODIMENTS

Figure 1:
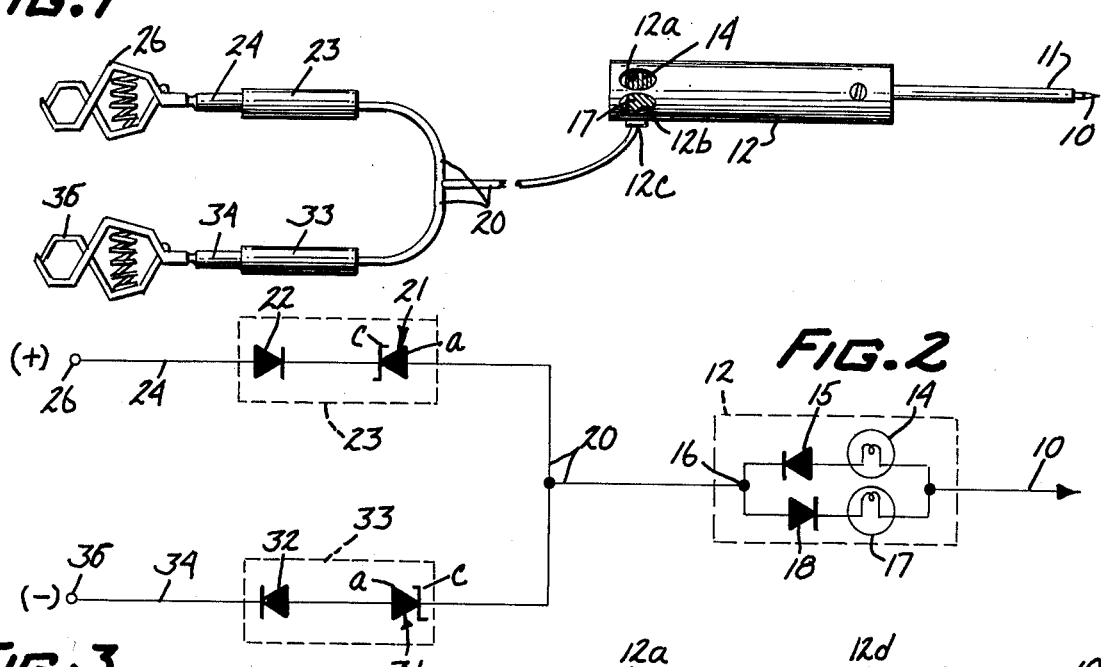
FIG. 1 is a diagrammatic view of one embodiment of the test probe of this invention.
Figure 2:
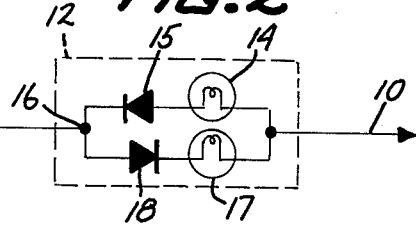
FIG. 2 is a schematic circuit diagram of the electrical components comprising the test probe of FIG. 1.

Referring to the Figures, wherein like numerals represent like parts throughout the severals views, there is generally shown in FIGS. 1 and 2 a first embodiment of an automotive DC test probe constructed according to the principles of this invention. An electrically conductive, generally rigid prod member 10 projects outwardly from and is secured within a generally cylindrical housing member 12. The housing member 12 is, in the preferred embodiment, constructed of an insulating plastic material and is sized to be easily held in the hand of a user. It will be understood, however, that the housing may be constructed of any suitable material. The housing 12 has first and second openings 12a and 12b respectively formed through the outer shell of the housing 12 and opening into its inner cavity. The housing 12 further has a third opening 12c formed therethrough for accommodating an electrical wire or conductor, hereinafter described. An insulator material, for example plastic or rubber 11 surrounds all but the outer terminous of the prod member 10.

The conductive prod member 10 is connected by means of a first indicator lamp 14 in series with a diode 15 to an electrical junction 16. The series connected indicator lamp 14 and diode 15 provide a first circuit path between the conductive prod member 10 and the electrical junction 16.

The condutive prod member 10 is also connected by means of a second indicator lamp 17 and a back biased diode 18 to the electrical junction 16. The series connected second indicator lamp and the diode 18 form a second circuit path, connected in parallel with the first circuit path, between the conductive prod member 10 and the electrical junction 16. In the preferred embodiment, the first indicator lamp has a red lamp shell for casting a red illuminating beam through the first opening 12a in the housing member 12, and the second indicator lamp 17 has a green lamp shell or casting a green illuminating beam through the second opening 12b of the housing member 12.

The electrical junction 16 is connected by means of a conductor 20 to the anode 21a of a zener diode 21. The zener diode 21 further has a cathode 21c connected by means of a back biased diode 22 connected by means of a conductor 24 to a first output terminal 26. The series connection of the zener diode 21 and the diode 22 comprise a first reference voltage establishing circuit 23.

The electrical junction 16 is also connected by means of the conductor 20 to the cathode 31c of a zener diode 31. The zewer diode 31 further has an anode 31a connected by means of a diode 32 and a conductor 34 to a second output terminal 36. The series connected zener diode 31 and the diode 32 comprise a second reference voltage establishing circuit 33.

The first and second output terminals 26 and 36 respectively may comprise any clip members, preferably of the spring biased type as illustrated in FIG. 1, which are suitable for clamping to the positive and negative (or ground) terminals respectively of an automotive storage battery (not illustrated). In the first embodiment of the invention, the first and second reference voltage establishing circuits 23 and 33 respectively are pysically mounted adjacent the first and second output terminals 26 and 36 respectively for common movement therewith. The electrical components of the first and second reference voltage establishing circuits 23 and 33 respectively are encased within a suitable insulating encapsulating material as illustrated in FIG. 1. In the preferred embodiment, the conductors 24 and 34 also have protecctive insulating outer surfaces. The conductor 20 may comprise any insulated elongate, flexible electrical wire and passes through the third opening 12c in the housing member 12, to connect the reference voltage establishing circuits 23 and 33 to the remotely located housing member 12.

Figure 5:
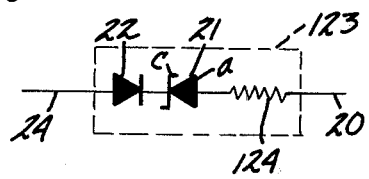
FIG. 5 is an alternate schematic circuit diagram of the first reference voltage establishing circuit of the test probe disclosed in FIG. 2 and FIG. 4.

The circuit components comprising the first and second reference voltage establishing circuits 23 and 33 respectively may be designed in a plurality of configurations which are suitable to establish a fixed reference voltage at the electrical junction 16, as measured with respect to the voltage levels appearing at the first and second output terminals 26 and 36 respectively. An example of one alternate embodiment of the first reference voltage establishing circuit 23 is illustrated at 123 in FIG. 5. Referring to FIG. 5, it will be noted that a current limiting resistor 124 has been added in series with the zener diode 21 and the diode 22, between the conductors 20 and 24. While not illustrated in the Figures, it will be understood that in any test probe circuit arrangement using that configuration of the first reference voltage establishing circuit illustrated in FIG. 5, a similar configuration of the second reference voltage establishing circuit which also uses a series connected current limiting resistor, would be employed to maintain the symmetry of the reference voltage establishing circuits.

Figure 6:
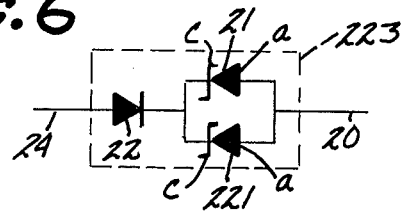
FIG. 6 is a second alternate circuit schematic diagram of the first reference voltage establishing circuit of the test probe disclosed in FIG. 2 and FIG. 4.

A second of many possible alternate configurations for the first reference voltage establishing circuit 23 is illustrated at 223 in FIG. 6. Referring to FIG. 6, a second zener diode 221 is connected in parallel with the zener diode 21, with the parallel combination of the zener diodes 21 and 221 connected in series with the back biased diode 22 between the conductors 20 and 24. It will also be understood that while not illustrated in the Figures, any test probe circuit using that configuration of the first reference voltage establishing circuit illustrated in FIG. 6, would also employ a similar circuit configuration for the second reference voltage establishing circuit which would also employ a pair of zener diodes connected in parallel, to maintain the symmetry of the reference voltage establishing circuits.

Figure 3:
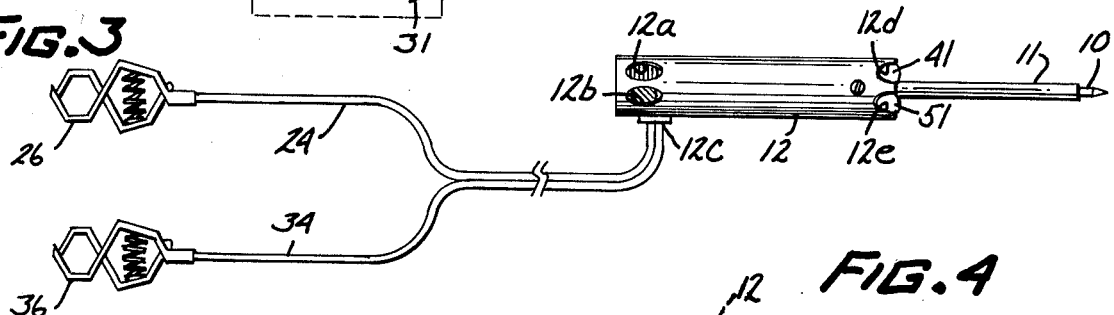
FIG. 3 is a diagrammatic view of a second embodiment of the test probe of the present invention.
Figure 4:
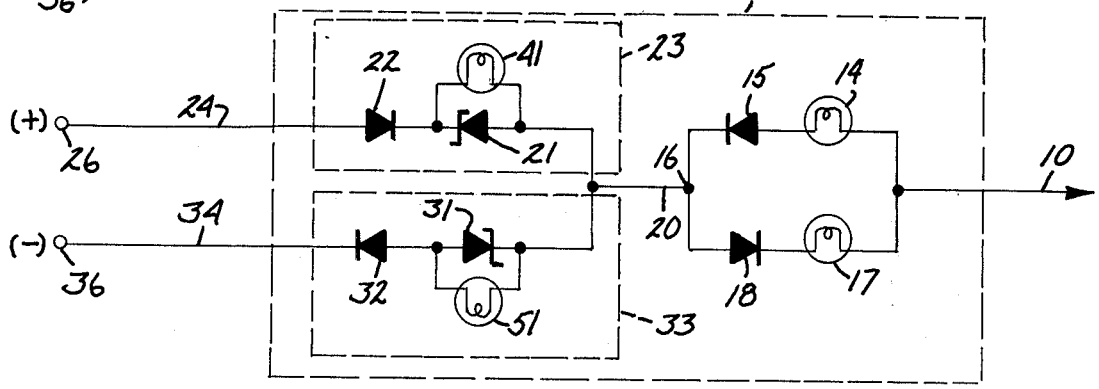
FIG. 4 is a schematic circuit diagram of the electrical components comprising the test probe disclosed in FIG. 3.

The second embodiment of the test probe of this invention is illustrated in FIGS. 3 and 4. Referring thereto, wherein like numerals are employed to represent like parts previously disclosed in FIGS. 1 and 2, it will be noted that the first and second reference voltage establishing circuits 23 and 33 respectively have been physically mounted within the housing member 12, and that the conductors 24 and 34 have been elongated to connect the first and second output terminals 26 and 36 respectively to the first and second reference voltage establishing circuits 23 and 33 respectively mounted within the housing member 12. The circuit schematic layout for the circuits of the first and second embodiments of the invention disclosed in FIGS. 2 and 4 respectively, are identical except for the inclusion of illuminating lights 41 and 51 respectively connected in parallel with the zener diodes 21 and 31 of the first and second reference voltage establishing circuits 23 and 33 respectively, in the second embodiment. In the second embodiment, the housing member 12 further includes fourth and fifth openings to the outer housing shell, 12d and e positioned adjacent that end of the housing member 12 throughwhich the prod member 10 extends. The illuminating lights 41 and 51 are mounted within the housing member 12 adjacent the fourth and fifth openings 12d and 12e therethrough so as to cast, when energized, their illuminating light external of the housing member and generally in the direction of projection of the prod member 10.

It will be understood that alternate configurations of the first and second reference voltage establishing circuits 23 and 33, and in particular those configurations thereof disclosed in FIGS. 5 and 6 can equally well be employed with the second embodiment configuration of the invention, wherein the twin-beam illuminating lights 41 and 51 would be connected in parallel with the appropriate zener diodes thereof.

The test probes of the preferred embodiments of the invention are designed for use in trouble shooting 12 volt automative electrical systems; however, the principles of this invention could equally well be applied to the design of test probes for measuring electrical parameters within other voltage ranges. Accordingly, in the preferred embodiment, the indicator lamps 14 and 17 may be number 40 or equivalent, capable of carrying 150 milliamps at 6.8 volts. The switching diodes disclosed in the circuits would typically be capable of carrying one amp. The zener diodes would typically be rated to provide a 6 volt reference level at one watt, and the twin-beam lights 41 and 51 would be number 46 or equivalent, generally operative to pass 250 milliamps at 6.8 volts.

OPERATION OF THE PREFERRED EMBODIMENT

The diodes 15 and 18 determine the direction of current flow through the first and second indicator lamps 14 and 17 respectively. Accordingly, when the prod member 10 engages a positive voltage level, positive current flow will be directed through the first indicator lamp 14 and the diode 15 to the junction 16. Therefore, illumination of the first indicator lamp 14 denotes the presence of a positive voltage level at the test prod 10. Conversely, if a negative or ground potential is applied to the test prod 10, positive current flow will be directed from the junction 16 (assuming that the junction 16 is at a positive potential) and through the diode 18 and second indicator lamp 17 to the test prod 10. Therefore, illumination of the second indicator lamp 17 to the test prod 10. Therefore, illumination of the second indicator lamp 17 indicates the presence of a negative or ground potential at the test prod 10.

In operation, the first and second output terminals 26 and 36 respectively are securely connected to the positive and common terminals respectively of a 12 volt battery (not illustrated). A tendency for positive current flow will thus be created from the first output terminal 26, through the first reference voltage establishing circuit 23 and the second reference voltage establishing circuit 33, to the second output terminal 36. In the preferred embodiment, the zener diodes 21 and 31 are 6 volt zener diodes; therefore, if the output voltage of the battery is 12 volts of less, there will not be sufficient voltage available for overcoming the forward diode drop resistances of the diodes 22 and 32 in combination with the 12 volt drop across the zener diodes 21 and 31. As soon as the test prod 10 comes into contact with either a positive or a common or negative voltage, however, a circuit path will be completed between either the first or second output terminal 26 and 36 respectively and the test prod 10 to establish current flow therebetween. When the test prod is touched to a positive potential, positive current flow will be directed from the test prod, through the first circuit path including the first indicator lamp 14, and through the second reference voltage establishing circuit 33, to the second output terminal 36. Current flow through the zener diode 31 will establish a 6 volt reference level at the junction 16, protecting the first indicator lamp 14 from voltage surges. Similarly, if the test prod 10 is touched to a common or negative potential, positive current flow will be directed from the first output terminal 26, through the first reference voltage establishing circuit 23, and the second circuit path containing the second indicator lamp 17, to the test prod 10. Current flow through the zener diode 21 will establish a 6 volt voltage reference level at the junction 16 for protecting the second indicator lamp 17 from voltage surges beyond its maximum ratings. Therefore, regardless of the voltage potential engaged by the prod member 10 the voltage applied across the indicator lamps 14 and 17 will always be maintained at a fixed reference voltage level as determined by the first and second reference voltage establishing circuits 23 and 33 resepctively.

The magnitude of the test signal applied to the prod member 10 can be determined by the brightness of illumination of the first and second indicator lamps 14 and 17 respectively, when compared with their relative illumination intensity when referenced to the voltage magnitude at either the positive or the negative terminal of the storage battery. For example, the first indicator lamp 14 will be energized at its maximum illumination intensity when the voltage applied to the test prod 10 is equal to the maximum positive voltage level occuring in the system (i.e. the positive battery potential of 12 volts). If a voltage of smaller magnitude (for example 8 volts) is applied to the test prod 10, a proportionately smaller voltage drop will be developed across the first indicator lamp 14, decreasing the magnitude of current flow therethrough and proportionately decreasing its illumination intensity. With this feature, poor electrical contact, either to the positive or to the ground terminals, can be rapidly connected by simply touching the prod member 10 successively to each side of the mechanical connection. If the same illumination intensity of the appropriate indicator lamp 14 or 17 is not displayed for both sides of the connection, a poor electrical connection is present. In addition to the electrical connection measurement above described, the test probe is ideally suitable for continuity checking, poor or missing ground or positive supply connections and for checking fuses in circuit without removing them from their sockets.

In the first embodiment of the invention, only a single conductor 20 is required to connect the positive and negative supply terminals of the storage battery by means of the reference voltage establishing circuits 23 and 33, to the circuits within the probe housing 12. The single wire constuction provides a very simple system which is easy to use and eliminates any twisting or entanglement of interconnecting wires, required by most test probe systems. Further, the inclusion of the circuit components comprising the first and second reference voltage establishing circuits 23 and 33 respectively adjacent the first and second output terminal clips 26 and 36 respectively, insures that these components will be physically protected by keeping them off of the floor or ground where they may be accidently stepped on or otherwise damaged.

The second embodiment of the invention, disclosed in FIGS. 3 and 4, includes the same reference voltage establishing circuit protection for the indicator lamps of the test probe, thus insuring their maximum operating life and reliability. In addition, the second embodiment features the dual beam illuminating lights 41 and 51 which are continuouly energized whenever the first and second output terminals 26 and 36 respectively are connected to the positive and ground terminals of a storage battery. Since the illuminating lights 41 and 51 are each connected in parallel with a zener diode within the appropriate reference voltage establishing circuit, these lights are also protected from over-voltage and transient stress conditions which would reduce the operative life and reliability of these lights. The twin beam feature of the second embodiment of the invention, integrates a trouble light feature into the test probe housing 12, eliminating the need for a supplemental trouble light and enabling the operator to rapidly and easily perform his trouble shooting operation in hard to see or dimly illuminated environments.

Other modificatins of the invention will be apparent to those skilled in the art in light of the foregoing description. This description is intended to provide concrete examples of individual embodiments which clearly disclose the present invention. Accordingly, the invention is not limited to any particular embodiment. All alternatives, modifications and variations of the present invention which fall within the spirit and broad scope of the appended claims are covered.

What is claimed is:

1. An automotive trouble-shooting test probe, comprising:
    a. an electrically conductive probe member;
    b. a first electrical terminal suitable for connection to a positive voltage output terminal of a storage battery;
    c. a second electrical terminal suitable for connection to a negative or ground voltage output terminal of a storage battery;
    d. a third electrical terminal;
    e. a first circuit path electrically connecting said probe member with said third electrical terminal, comprising a first indicator lamp and a first current rectifying device serially connected between said probe member and said third electrical terminal for normally enabling positive current flow therethrough only in the direction from said probe member to said third electrical terminal;
    f. a second circuit path electrically connected in parallel with said first circuit path between said probe member and said third electrical terminal, comprising a second indicator lamp and a second current rectifying device serially connected between said probe member and said third electrical terminal for normally enabling positive current flow therethrough only in the direction from said third electrical terminal to said probe member; and
    g. a third circuit path, independent of said first and said second circuit paths, electrically connecting said first and said second terminals with said third terminal, comprising reference circuit means responsive to at least a predetermined threshold voltage level between said first or said second electrical terminals and said third electrical terminal, for establishing a fixed voltage reference level at said third electrical terminal, as measured with respect to the voltage levels present at said first and said second electrical terminals.

2. An automotive trouble-shooting test probe as recited in claim 1, wherein said reference circuit means comprises:
    a. a first reference voltage establishing circuit including a zener diode connected in circuit between said first and said thrid electrical terminals for establishing, responsive to current flow therethrough, a fixed voltage reference level at said third electrical terminal with respect to the voltage level at said first electrical terminal; and
    b. a second reference voltage establishing circuit including a zener diode connected in circuit between said second and said third electrical terminals for establishing, responsive to current flow therethrough, a fixed voltage reference level at said third electrical terminal with respect to the voltage level at said second electrical terminal.

3. An automotive trouble-shooting test probe as recited in claim 1, wherein said reference circuit means comprises:
   a. a first reference voltage establishing circuit including a first zener diode and a third current rectifying device connected in electrical series between said first and said third electrical terminals, said third current rectifying device being connected to normally block positive current flow therethrough in the direction toward said first electrical terminal, and said first zener diode being connected to establish, responsive to current flow therethrough, a fixed voltage reference level at said third electrical terminal with respect to the voltage level at said first electrical terminal; and
   b. a second reference voltage establishing circuit including a second zener diode and a fourth current rectifying device connected in electrical series between said second and said third electrical terminals, said fourth current rectifying device being connected to normally block positive current flow therethrough in the direction away from said second electrical terminal, and said second zener diode being connected to establish, responsive to current flow therethrough, a fixed voltage reference level at said third electrical terminal with respect to the voltage level at said second electrical terminal.

4. An automotive trouble-shooting test probe as recited in claim 3, wherein said first reference voltage establishing circuit further includes a first resistor connected in electrical series with first zener diode and said third current rectifying device, between said first and said third electrical terminals; and wherein said second reference voltage establishing circuit includes a second resistor connected in electrical series with said second zener diode and said fourth current rectifying device between said second and said third electrical terminals.

5. An automotive trouble-shooting test probe as recited in claim 3, wherein said first voltage reference establishing circuit is further characterized by a third lamp electrically connected in parallel with said first zener diode; wherein said second reference voltage establishing circuit is further characterized by a fourth lamp electrically connected in parallel with said second zener diode; wherein said test probe further comprises:
   a. a hand-held generally cylindrical housing member;
   b. means for mounting said first, said second and said third circuit path components and said third electrical terminal within said housing member;
   c. means for mounting said probe member to one end of said housing member to project outwardly therefrom;
   d. wherein said third and said fourth lamps are mounted to said housing member adjacent said probe member and are oriented so as to project when energized illuminating light in the direction of said projecting probe member;
   e. wherein said first and said second indicator lamps are mounted to said housing members so as to be substantially visible from external of said housing member; and
   f. elongate flexible electrical conductor members for directly connecting said first and said second reference voltage establishing circuits respectively to said first and said second electrical terminals.

6. An automotive trouble-shooting test probe as recited in claim 3, wherein said first reference voltage establishing circuit further includes a third zener diode connected in parallel with said first zener diode; and wherein said second reference voltage establishing circuit further includes a fourth zener diode electrically connected in parallel with said second zener diode.

7. An automotive trouble-shooting test probe as recited in claim 1, wherein said test probe further comprises a hand-held housing member mounting said first and said second circuit path components and said third terminal; wherein said probe member is mounted to said housing and has a portion thereof projecting outwardly therefrom; and wherein said third circuit path is further characterized by:
   a. said reference circuit means comprising:
      i. a first voltage reference establishing circuit including a first zener diode connected for establishing, responsive to current flow therethrough, a fixed voltage reference level at its anode with respect to the voltage level at said first electrical terminal;
      ii. a second voltage reference establishing circuit including a second zener diode connected for establishing, responsive to current flow therethrough, a fixed voltage reference level at its cathode with respect to the voltage level at said second electrical terminal;
      iii. means for mounting said first zener diode to said first electrical terminal for physical movement therewith;
      iv. means for mounting said second zener diode to said second electrical terminal for physical movement therewith; and
      v. a first conductor connecting in circuit the anode of said first zener diode with the cathode of said second zener diode; and
   b. a single elongate flexible conductor directly connecting in circuit said first conductor with said third terminal.

8. An automotive trouble-shooting test probe as recited in claim 7, wherein said first voltage reference establishing circuit further includes a third current rectifying device mounted for common movement with said first electrical terminal and connected in electrical series with said first zener diode between said first electrical terminal and said first conductor, said third current rectifying device being connected to normally block positive current flow therethrough in the direction toward said first electrical terminal; and wherein said second voltage reference establishing circuit further includes a fourth current rectifying device mounted for common movement with said second electrical terminal and connected in electrical series with said second zener diode between said second electrical terminal and said first conductor, said fourth current rectifying device being connected to a normally block positive current flow therethrough in the direction away from said second electrical terminal.

9. An automotive trouble-shooting test probe as recited in claim 8, wherein said first voltage reference establishing circuit further comprises a first resistor connected in electrical series with said first zener diode and said third current rectifying device; and wherein said second voltage reference establishing circuit further includes a second resistor connected in electrical series with said second zener diode and said fourth current rectifying device.

10. An automotive trouble-shooting test probe as recited in claim 8, wherein said first voltage reference establishing circuit further includes a third zener diode electrically connected in parallel with said first zener diode and mounted for common movement therewith; and wherein said second voltage reference establishing circuit further includes a fourth zener diode electrically connected in parallel with said second zener diode and mounted for common movement therewith.

11. An automotive trouble-shooting test probe apparatus, comprising:
 a. a housing member suitable for being hand-held;
 b. an electrically conductive probe member mounted to said housing member and having a portion thereof projecting outwardly from said housing member;
 c. a first electrical circuit mounted in said housing and comprising a first indicator lamp and a first rectifying diode electrically connected in series between said probe member and a first conductor junction, said first diode being operable to block positive current flow therethrough in the direction to said probe member;
 d. a second electrical circuit mounted in said housing and connected in parallel with said first electrical circuit, comprising a second indicator lamp and a second rectifying diode connected in electrical series between said probe member and said first junction, said second diode being operable to normally block positive current flow therethrough in the direction to said first junction;
 e. means for mounting said first and said second indicator lamps to said housing member such that said lamps are respectively directly visible external of said housing member;
 f. an elongate flexible single conductor connecting said first junction within said housing member to a second conductor junction remotely located from said housing member;
 g. a first voltage reference establishing circuit comprising a first electrical terminal suitable for connection to a positive voltage terminal of an automobile storage battery, a first zener diode and a third rectifying diode connected in series between said first terminal and said second junction for establishing responsive to application of at least a predetermined threshold voltage therebetween a fixed reference voltage level at said second junction when measured with respect to the voltage level at said first terminal, and means for mounting said first zener diode and said third rectifying diode for common movement with said first terminal; and
 h. a second voltage reference establishing circuit comprising a second electrical terminal suitable for connection to a negative voltage terminal of an automobile storage battery, a second zener diode and a fourth rectifying diode connected in series between said second terminal and said second junction for establishing responsive to application of at least a predetermined threshold voltage therebetween a fixed reference voltage level at said second junction when measured with respect to the voltage level at said second terminal, and means for mounting said second zener diode and said forth rectifying diode for common movement with said second terminal; and 12. An automotive trouble-shooting test probe apparatus, comprising:
 a. a housing member suitable for being hand-held;
 b. an electrically conductive probe member mounted to said housing member and having a portion thereof projecting outwardly from said housing member;
 c. a first electrical path comprising a first indicator lamp and a first diode electrically connected in series between said probe member and a first electrical junction, said first indicator lamp being mouted so as to cast its illuminating light external of said housing;
 d. a second electrical path comprising a seccond indicator lamp and a second back-biased diode electrically connected in series between said probe member and said first electrical junction, said second indicator lamp being mounted so as to cast its illumination light external of said housing;
 e. a first connector clamp external of said housing suitable for connection to said a positive terminal of an automotive storage battery;
 f. a second connector clamp external of said housing suitable for connection to a negative terminal of an automotive storage battery;
 g. third and fourth lamps mounted in said housing member adjacent said probe member for casting twin illuminating beams of light external of said housing in the direction of said projecting probe member;
 h. a reference voltage establishing circuit electrically connecting said first and said second connector clamps with said first electrical junction, comprising:
  i. a third diode connected in series with a first zener diode and between said first connector clamp and said first electrical junction for establishing a fixed voltage reference level at said first junction in response to positive current flow through said first zener diode in the direction toward said first junction; and
  ii. a fourth back-biased diode connected in series with a second zener diode between said second connector clamp and said first electrical junction for establishing a fixed voltage reference level at said first junction responsive to said positive current flow through said second zener diode in the direction away from said first junction; and
 i. means for electrically connecting said third and said fourth lamps in parallel respectively with said first and said second zener diodes.

* * * * *

UNITED STATES PATENT AND TRADEMARK OFFICE
CERTIFICATE OF CORRECTION

PATENT NO. : 4,028,621
DATED : June 7, 1977
INVENTOR(S) : James M. Bloxam

It is certified that error appears in the above-identified patent and that said Letters Patent are hereby corrected as shown below:

In column 8, line 61, the word "thrid" should read --third--.

In column 9, line 36, between the words "with" and "first", insert --said--.

In column 10, line 61, before "normally", delete the word "a".

In column 12, line 21, the word "mouted" should read --mounted--; in line 23, the word "seccond" should read --second--; and in line 30, the word "said" appearing before the word "a", should be deleted.

Signed and Sealed this

Twenty-seventh Day of September 1977

[SEAL]

Attest:

RUTH C. MASON
Attesting Officer

LUTRELLE F. PARKER
Acting Commissioner of Patents and Trademarks